United States Patent
Lee et al.

(10) Patent No.: US 9,287,127 B2
(45) Date of Patent: Mar. 15, 2016

(54) WAFER BACK-SIDE POLISHING SYSTEM AND METHOD FOR INTEGRATED CIRCUIT DEVICE MANUFACTURING PROCESSES

(71) Applicant: Taiwan Semiconductor Manufacturing Co., Ltd., Hsin-Chu (TW)

(72) Inventors: Shen-Nan Lee, Jhudong Township (TW); Teng-Chun Tsai, Hsinchu (TW); Hsin-Hsien Lu, Hsinchu (TW); Chang-Sheng Lin, Baoshan Township (TW); Kuo-Cheng Lien, Hsinchu (TW); Kuo-Yin Lin, Jhubei (TW); Wen-Kuei Liu, Xinpu Township (TW); Yu-Wei Chou, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 23 days.

(21) Appl. No.: 14/181,814

(22) Filed: Feb. 17, 2014

(65) Prior Publication Data
US 2015/0235858 A1 Aug. 20, 2015

(51) Int. Cl.
*H01L 21/302* (2006.01)
*H01L 21/306* (2006.01)
(Continued)

(52) U.S. Cl.
CPC .......... *H01L 21/30625* (2013.01); *B24B 7/228* (2013.01); *B24B 9/065* (2013.01); *B24B 21/002* (2013.01); *H01L 21/02057* (2013.01); *H01L 22/12* (2013.01); *H01L 22/20* (2013.01)

(58) Field of Classification Search
CPC ................. H01L 21/02035; H01L 21/30625; H01L 21/02016; B24B 7/228; B24B 27/0076; B24B 9/065; B24B 21/002

USPC ............................................. 438/690; 451/57
See application file for complete search history.

(56) References Cited

U.S. PATENT DOCUMENTS 6,312,487 B1 * 11/2001 Tanaka ............................ 51/309
6,933,234 B2 * 8/2005 Nakamura .............. B24B 9/065
134/1.3
(Continued)

FOREIGN PATENT DOCUMENTS

| TW | 391910 B | 6/2000 |
| TW | 225273 | 10/2003 |
| TW | 561542 B | 11/2003 |

OTHER PUBLICATIONS

Translation of European Patent 0832717 A2 (Hasegawa et al. ), Apr. 1, 1998, 8 pages.*

*Primary Examiner* — Caridad Everhart
(74) *Attorney, Agent, or Firm* — Eschweiler & Associates, LLC

(57) ABSTRACT

A wafer polishing process includes polishing a central area on the back side of a wafer, polishing a peripheral area on the back side of the wafer, buffing the central area, and buffing the peripheral area. The process can significantly reduce scratch-related wafer breakage, can correct focus spots on wafers, and can replace cleaning processes that use chemical etchants. Polishing and buffing can include polishing and buffing the bevel region. Further improvements include polishing with abrasive pads having a soft backing, polishing or buffing with pads having relatively soft abrasive particles, polishing or buffing with abrasive pads made from abrasive particles that have been sorted and selected for regularity of shape, irrigating the surface being polished or buffed with an aqueous solution that includes a friction-reducing agent, and buffing with abrasive pads having 20 k or finer grit or non-abrasive pads.

20 Claims, 9 Drawing Sheets

(51) Int. Cl.
*B24B 9/06* (2006.01)
*B24B 7/22* (2006.01)
*B24B 21/00* (2006.01)
*H01L 21/66* (2006.01)
*H01L 21/02* (2006.01)

(56) References Cited

U.S. PATENT DOCUMENTS

2007/0141955 A1\* 6/2007 Masuda ............................ 451/11
2008/0113509 A1\* 5/2008 Sakairi ........................... 438/690

\* cited by examiner

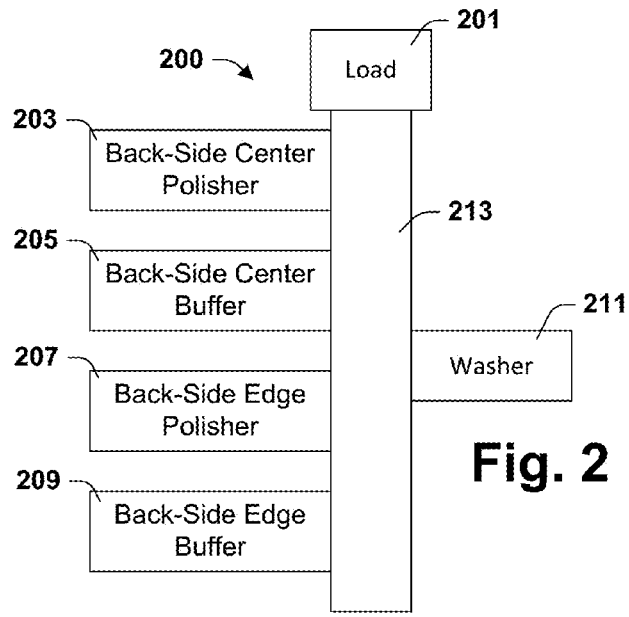
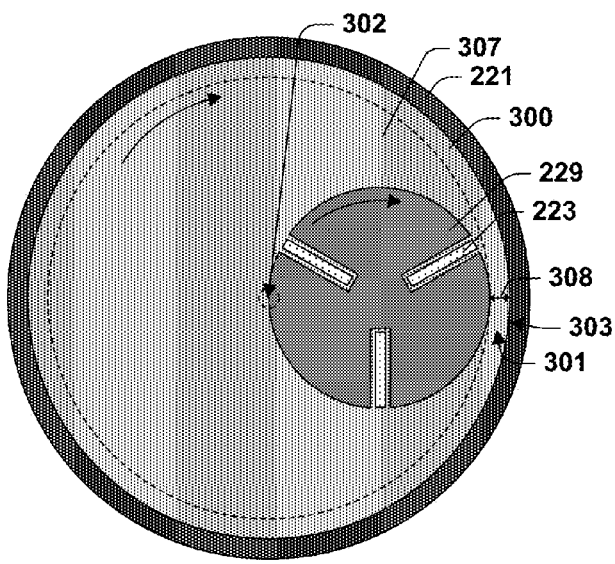
Fig. 3A
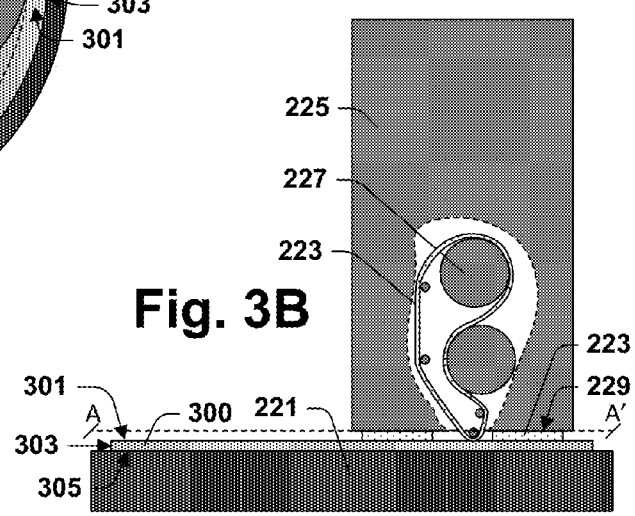
Fig. 3B

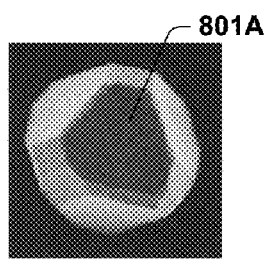 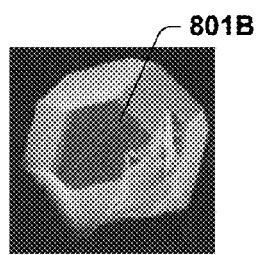 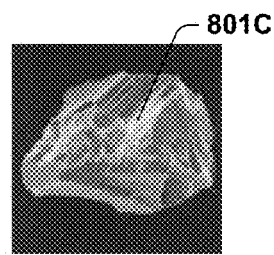
Fig. 15A  Fig. 15B  Fig. 15C
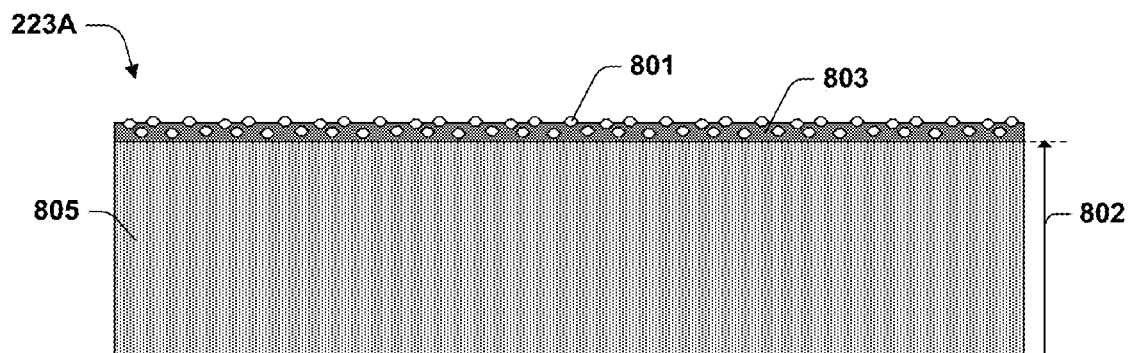
Fig. 16

WAFER BACK-SIDE POLISHING SYSTEM AND METHOD FOR INTEGRATED CIRCUIT DEVICE MANUFACTURING PROCESSES

BACKGROUND

The present disclosure relates to systems and methods for cleaning wafers within integrated circuit (IC) device manufacturing processes and to systems and methods for polishing wafers.

Since the advent of the integrated circuit, the semiconductor industry has continuously sought to improve the density of integrated circuit components devices (transistors, diodes, resistors, capacitors, etc.). For the most part, improvements in density have come from reductions in feature size, allowing more components to be formed within a given area.

An essential tool for integrated circuit device manufacturing is photolithography. The minimum feature size that can be resolved by a photolithography system is referred to as the critical dimension (CD). The smaller the CD, the more difficult it becomes to keep an image in focus across a wafer surface. Contaminants and residues left on the back side of a wafer by prior processing can prevent the wafer from lying flat and cause defocus issues (focus spots). The back sides of wafers are often cleaned in preparation for photolithography to avoid focus spots.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is a schematic illustration of a wafer polishing tool in accordance with some other embodiments of the present disclosure.

FIG. 3A is a top view of a wafer polishing head applied against a back-side center region of a wafer in accordance with some embodiments of the present disclosure with the polishing spindle cutaway above the plane A-A' of FIG. 3B.

FIG. 3B is a side view of a wafer polishing spindle applied against a back-side center region of a wafer in accordance with some embodiments of the present disclosure.

FIGS. 15A-15C show abrasive particles having varying degrees of regularity in accordance with some embodiments of the present disclosure.

FIG. 16 illustrates a cross-section of a polishing tape according to some embodiments of the present disclosure.

DETAILED DESCRIPTION

Figure 1:
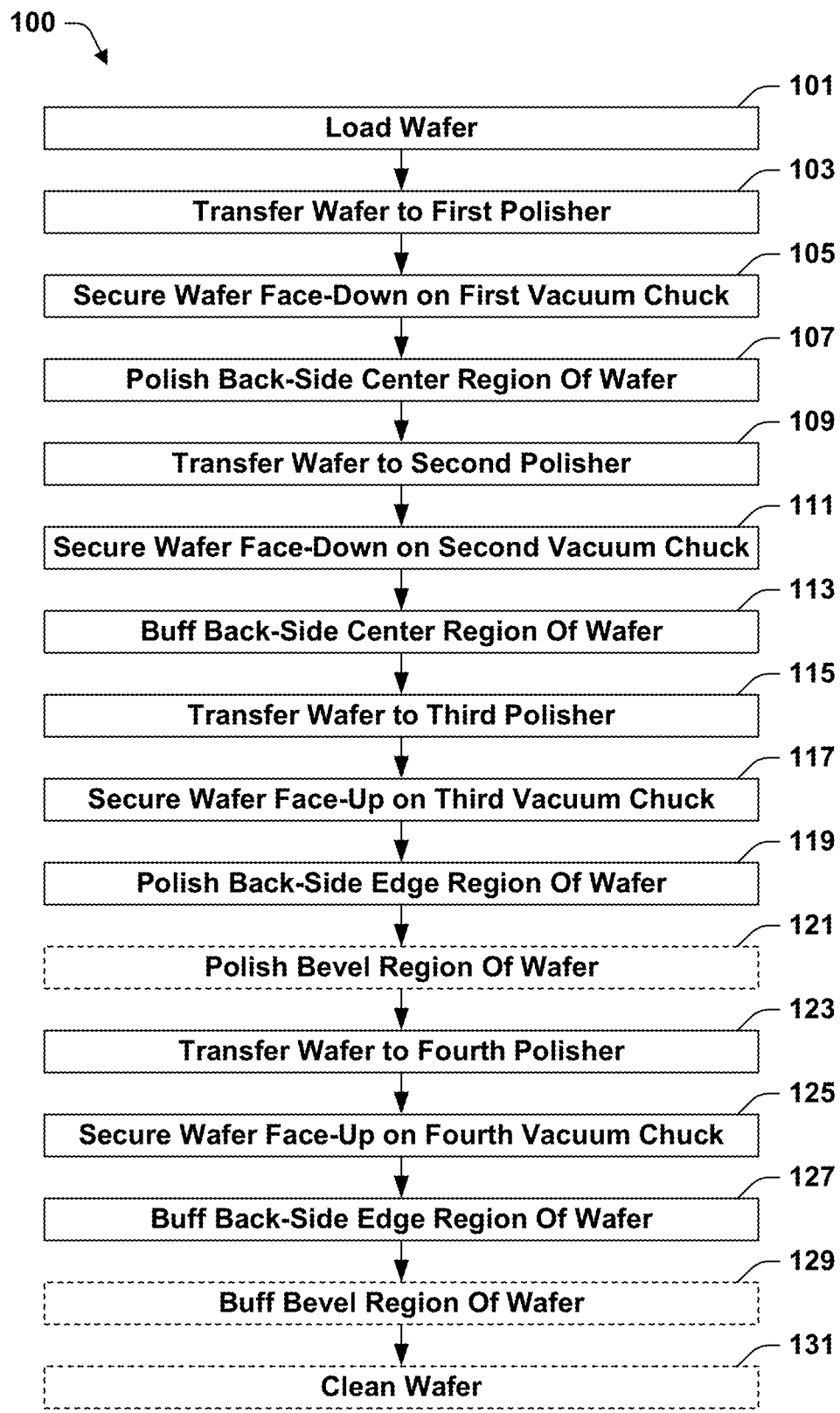
FIG. 1 is a flow chart illustrating a wafer polishing process in accordance with some embodiments of the present disclosure.

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Cleaning processes that use chemical etchants have been used to prepare wafers for photolithography. These chemical etchants tend to have an uneven effect among different materials. Back-side polishing had been tried as a substitute for cleaning with chemical etchants, but abrasives used in polishing left scratches that led to excessive wafer breakage rates. In addition, focus spots would sometime occur after polishing.

The present disclosure provides systems and methods for polishing wafers. The systems and methods can be used to prepare wafers for photolithography and can prevent focus spots without leading to excessive wafer breakage. According to some embodiments of the present disclosure, a system and method for polishing wafers include separate stages of polish and buffing a whole wafer back-side. Buffing after polishing and other measures described herein were found to significantly reduce scratch-related breakage. It was also found that focus spots that occurred after polishing often stemmed from particulate debris originating from the bevel region's wafer. According to some embodiments of the present disclosure, a system for and method of polishing wafers includes polishing the whole wafer back side and all or part of the bevel region.

FIG. 1 is a flow chart of a wafer polishing process 100 according to some embodiments of the present disclosure. FIG. 2 illustrates a wafer polishing tool 200 according to some other embodiments of the present disclosure. Polishing tool 200 is an example of a tool in which polishing process 100 can be implemented. Polishing tool 200 includes a loading device 201, a back-side center polisher 203, a back-side center buffer 205, a back-side edge polisher 207, a back-side edge buffer 209, and optionally one or more washers 211. A central area 213 of polishing tool 200 contains equipment for transporting wafers among the various units of polishing tool 200.

Polishing process 100 begins with act 101, loading a wafer 300 (not shown in FIG. 2) into polishing tool 200. Wafer 300 is then transferred with act 103 to a first polisher, which is back-side center polisher 203. Back-side center polisher 203 includes a vacuum chuck 221. Act 105, is placing wafer 300 face down on vacuum chuck 221 and securing it there as shown in FIGS. 3A and 3B.

Act 107 is polishing wafer 300 over a back-side center region 307 as shown in FIGS. 3A and 3B. Wafer 300 includes two faces that are nearly planar. One face is back side 301. The other is front side 305. In some embodiments, integrated circuit component devices have been formed of front side 305. In some embodiments, the integrated circuit component devices structures include field effect transistors. In some embodiments, the integrated circuit component devices structures include dynamic random access memory cells. A bevel region 303 is an outer edge of wafer 303. Bevel region 300 is the surface of wafer 300 that spans the distance between back side 301 and front side 305.

Back-side center region 307 is a central area on back side 301 of wafer 300. Back-side center region 307 extends from center 302 to a distance 308 short of the edge where back side 301 meets bevel region 303. In most embodiments, distance 308 is small compared to the radius of wafer 300. In some embodiments, the diameter of wafer 300 is in at least 150 mm. In some embodiments, distance 308 is at least 2 mm and no greater than 32 mm. In some embodiments, distance 308 is at least 4 mm and no greater than 16 mm. Distance 308 can be, for example, about 8 mm.

Spalling and the like are reduced by keeping polishing head 229 of spindle 225 of back-side center polisher 203 displaced from the edge of bevel region 303 as shown in FIGS. 3A and 3B. Polishing head 229 sweeps back-side center region 307. In some embodiments, the travel of polishing head 229 across back-side center region 307 is driven by spinning wafer 300 with vacuum chuck 221.

Spindle 225 includes polishing head 229 on an end that faces wafer 300. Polishing head 229 applies polishing pads 223 to wafers 300. In some embodiments, polishing pads 223 are polishing tape. In some embodiments a polishing tape 223 is mounted on rollers 227 within spindle 225 as shown in the cutaway of FIG. 3B. In most embodiments, spindle 225 along with polishing head 229 is rotated as shown in FIG. 3A. In some embodiments, the direction that spindle 225 rotates is the same a direction in which chuck 221 rotates.

Polishing pads 223 used for polishing wafer 300 over back-side center region 307 are abrasive pads. In some embodiments abrasive particles on an abrasive pad are diamond, $Al_2O_3$, $SiO_2$, SiC, or SiN. According to some embodiments of the present disclosure, a system for and method of polishing wafers includes polishing or buffing with abrasive particles that are relatively soft. Relatively soft abrasive particle are approximately as hard or less hard than $SiO_2$. In most embodiments, polishing pads 223 used for polishing wafer 300 over back-side center region 307 are 10 k grit or coarser.

According to some embodiments of the present disclosure, a system for and method of polishing wafers includes polishing or buffing with abrasive particles that have been sorted and selected for regularity of shape. Regularly shaped particles cause less scratching than irregularly shaped particles. In some embodiments, the abrasive particles have a high degree of shape regularity. In some embodiments, the abrasive particles are regularly shaped diamonds.

FIGS. 15A-15C illustrate three abrasive particles 801 sorted according to regularity of shape. Particle 801A of FIG. 15A has a high degree of regularity. Particle 801B of FIG. 15B has an intermediate degree of regularity. Particle 801C of FIG. 15C has an irregular shape. Regularity of shape relates to a propensity to cause scratching. Regularity of shape can be determined using any criteria that relates to that propensity and sorts particles of equal size accordingly. In some embodiments, a particle is considered irregular if it has two faces of a minimum extent that form a dihedral angle below a minimum angle. In some embodiments, a particle is considered irregular if it has a protrusion exceeding a minimum size and subtending a solid angle less than or equal to a maximum. In some embodiments, the minimum size can be, for example, the depth to which the protrusion can fit into a cone subtending the maximum solid angle. In some embodiments, the minimum height is at least 10% the mean particle diameter corresponding to the abrasive's grit.

In some embodiments, a particle is considered irregular if less than a minimum percentage of its volume corresponds to a single crystal structure. In some embodiments, a particle is considered irregular if less than a minimum percentage of its external surface corresponds to a particular crystal shape. In some embodiments, the particular crystal shape is the cubocta shape of FIG. 15A. In some embodiments, a plurality of criteria are applied to exclude irregular particles. Criteria for shape regularity can be selected to be satisfied by particle 801A of FIG. 15A and to not be satisfied by particle 801C of FIG. 15C. In some embodiments, the criteria for shape regularity are satisfied by particle 801B of FIG. 15B. In some other embodiments, the criteria for shape regularity require a high degree of regularity and are not satisfied by particle 801B of FIG. 15B.

In some embodiments, regularly shaped particles are selected for regularity of shape from among similarly sized particles of the same material by a machine that acquires one or more images of each particle and sorts the particle based on analysis of those images. In some embodiments, whether the abrasive particles have been selected for regularity of shape can be determined by subsequent analysis and comparison to information for known sources of that material. For example, statistical averages for regularity can be determined for diamonds from known sources, both naturally occurring and synthetic. If the regularity of diamonds in an abrasive exceeds the statistical average for diamonds of that size from any known source, then it can be concluded that the diamonds have been selected for shape regularity.

According to some embodiments of the present disclosure, a system for and method of polishing wafers includes polishing or buffing with an abrasive pad having a soft backing. A soft backing is pad of material as soft or softer than polyurethane or polyethylene terephthalate (PET). In some embodiments, the soft backing is of a material selected from the group consisting of polyurethane, polyethylene terephthalate (PET), and copolymers thereof. A suitable soft backing for an abrasive pad can reduce scratching. FIG. 16 shows a cross-section of an abrasive polishing tape 223 having a soft backing 805 in accordance with some embodiments of the present disclosure. Abrasive particles 801 can be attached to soft backing 805 by a binder 803. In some embodiments, the thickness 802 of soft backing 805 is at least about 25 μM. In some embodiments, the thickness 802 of soft backing 805 is no more than about 100 μM.

In some embodiments, polishing wafer 300 over back-side center region 307 includes irrigating the surface being polished. In some embodiments, irrigation includes directing a stream of water at a target on wafer 300. In some embodiments, water used for irrigation is de-ionized or distilled.

According to some embodiments of the present disclosure, a system for and method of polishing wafers irrigates a surface being polished or buffed with a friction-reducing agent. In some embodiments, the friction-reducing agent is a wetting agent. In some embodiments, the wetting agent is a surfactant. In some embodiments the surfactant is sodium dodecyl sulfate (SDS). In some embodiments the surfactant is a polymerized formed from a di(alky)acrylate of the general formula $CH_2=CR^1COOC_nH_{2n}OOCR^1C=CH_2$, where $R^1$ is a hydrocarbon and n is one or greater. In some embodiments, the friction-reducing agent is a chelating agent. In some embodiments, the chelating agent is citric acid or ethylenediaminetetraacetic acid (EDTA). In some embodiments, the friction-reducing agent is an abrasive-free slurry. Friction-reducing agents can significantly reduce scratching in a polishing or buffing operation.

Polishing process 100 continues with act 109, transferring wafer 300 to a second polisher, which is back-side center buffer 205. Back-side center buffer 205 can be of the same design as back-side center polisher 203 and has corresponding embodiments, except that back-side center buffer 205 uses polishing pads 223 that have a very fine grit or are non-abrasive. In some embodiments, back-side center buffer 205 is of the same design as back-side center polisher 203. Back-side center buffer 205 buffs instead of polishes. In the present disclosure, buffing is polishing that uses polishing pads 223 that have a very fine grit or are non-abrasive. A very fine grit is 20 k or finer.

Act 111 is securing wafer 300 by front side 305 to a vacuum chuck 221 of back-side center buffer 205. Act 113 is buffing wafer 300 over back-side center region 307. In some embodiments, buffing wafer 300 over back-side center region 307 uses abrasive pads 223 having 20 k or finer grit. In some embodiments, polishing pads 223 used for buffing wafer 300 over back-side center region 307 are made from abrasive particles that have been sorted and selected for regularity of shape. In some embodiments, polishing pads 223 used for buffing wafer 300 over back-side center region 307 are abrasive pads having a soft backing. In some embodiments, buffing over back-side center region 307 uses non-abrasive pads 223. In some embodiments, the non-abrasive pads include a buffing surface formed of a material selected from the group consisting of polyurethane, polyethylene terephthalate (PET), and copolymers thereof.

Buffing 113 can include additional measures that reduce scratching. In some embodiments, buffing 113 includes irrigating the surface being buffed. In some embodiments, a friction-reducing agent is added to the water used to irrigate the surface being buffed. In some embodiments, buffing 113 is buffing with a low downward force. It has been found that using a low downward force during buffing can significantly reduce scratching. A low downward force is 2 psi or less. In some embodiments, the low downward force is 0.8 psi or less. Downward force is determined in relation to the gross area of contact between polishing pads 223 and the surface being buffed.

Figure 4A:
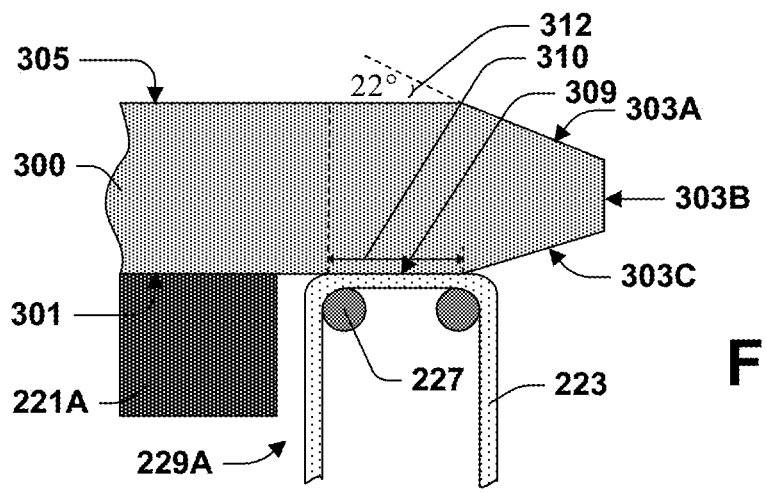
FIG. 4A illustrates a wafer polishing head applied against a back-side edge region of a wafer in accordance with some embodiments of the present disclosure.

Polishing process 100 continues with act 115, transferring wafer 300 to a third polisher, which is back-side edge polisher 207. Act 117 is securing wafer 300 to a vacuum chuck 221A of back-side edge polisher 207 as shown in FIG. 4A. In some embodiments, wafer 300 is secured to vacuum chuck 221A face up as shown in FIG. 4A. In other embodiments, wafer 300 is secured to vacuum chuck 221A face down.

Act 119 is polishing a back-side edge region 309 of wafer 300 as shown in FIG. 4A. Back-side edge region 309 is an annular region on the periphery of back side 301. Back-side edge region 309 is of width 310 and borders bevel region 303. Width 310 is greater than width 308, whereby back-side edge region 309 overlaps back-side center region 307 and back-side edge region 309 together with back-side center region 307 span the entire back side 301. In most embodiments, width 310 is zero to 40 mm wider than width 308. In some embodiments, width 310 is 1 to 10 mm wider than width 308. Accordingly, the overlap between back-side center region 307 and back-side edge region 309 can be, for example, about 4 mm.

FIG. 4A illustrates parts of back-side edge polisher 207. These include vacuum chuck 221A and polishing head 229A. Polishing head 229A include rollers 227A and polishing pad 223A. In some embodiments, polishing pad 223A is an abrasive tape. In some embodiments, polishing tape 223A is wound on rollers 227A as vacuum chuck 221A spins wafer 300 about its center 302.

Act 119, polishing back-side edge region 309, can include measures that reduce scratching as described for act 107, polishing back-side center region 307, and has corresponding embodiments. In some embodiments, polishing 119 is done with polishing pads 223 having a soft backing. In some embodiments, polishing 119 is done with polishing pads 223 having relatively soft abrasive particles. In some embodiments, polishing 119 is done with polishing pads 223 made from abrasive particles that have been sorted and selected for regularity of shape. In some embodiments, polishing 119 includes irrigating the surface being polished. In some embodiments, polishing 119 includes adding a friction-reducing agent to the water used for irrigation.

Figure 4B:
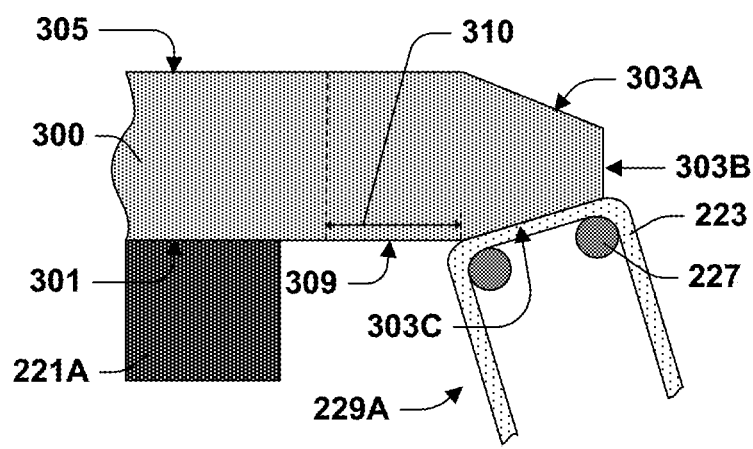
FIGS. 4B-4D illustrate a wafer polishing head applied against a bevel region of a wafer in accordance with some embodiments of the present disclosure.
Figure 4C:
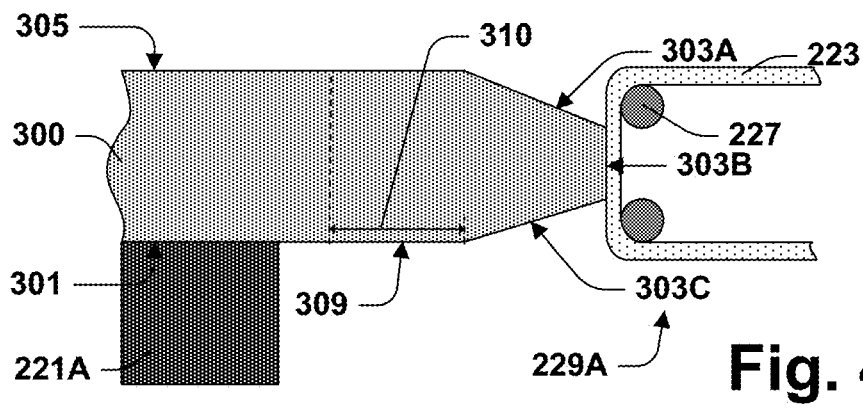
Figure 4D:
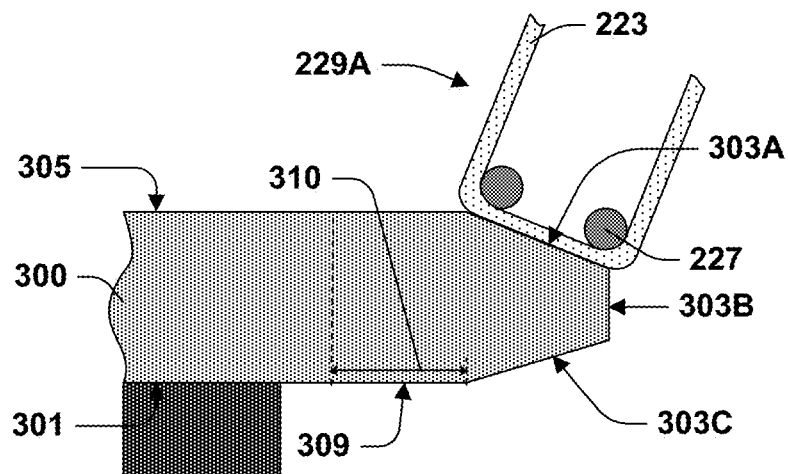

Polishing process 100 continues with act 121, which is an optional act of polishing all or part of bevel region 303. In some embodiments, polishing 121 is combined with polishing 119 into a single process carried out with back-side edge polisher 207 as shown in FIGS. 4B-4D. In some embodiments, polishing 121 is carried out with a distinct polisher from back-side edge polisher 207.

"Bevel region" is a term of art and bevel region 303 need not be beveled. In some embodiments, bevel region 303 is beveled as shown for wafer 300 in FIGS. 4A-4D. In some of these embodiments, the bevel angle 312 is between 17° and 27°. In some other embodiments, bevel region 303 is rounded as shown for wafer 300B in FIG. 4E.

In some embodiments, act 121 includes polishing bevel region 303 on a surface 303B that is at a right angle to the wafer back side 301 as shown in FIG. 4C. In some embodiments, act 121 includes polishing bevel region 303 on a surface 303A that is on the same side of bevel region 303 as front side 305 as shown in FIG. 4D and a surface 303C that is on the same side of bevel region 303 as back side 301 as shown in FIG. 4B. In some embodiments, act 121 polishes at least half the area of the bevel region 303. In some embodiments, act 121 polishes the entire bevel region 303.

Figure 4E:
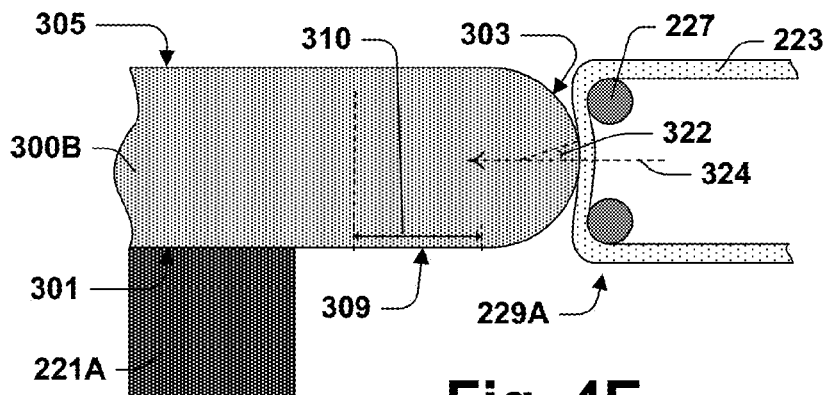
FIG. 4E illustrates a wafer polishing head applied against a bevel region of another wafer in accordance with some embodiments of the present disclosure.

In some embodiments, polishing head 229A used in act 121, polishing all or part of bevel region 303, allows a polishing pad 223 to wrap and conform to a portion of the surface being polished as shown in FIG. 4E. Wrapping and conforming in this way allows polishing head 229A to act on surfaces angled by an amount 322 away from the angle of incidence 324 of polishing head 229A. In some embodiments, the amount 322 can be at least about ±5°. In some embodiments, the amount 322 can be at least about ±10°.

In some embodiments, a polishing head 229A is applied to both back-side edge region 309 and bevel region 303. In some other embodiments, a polishing head 229A is applied to back-side edge region 309 and one or more distinct polishing heads 229A are applied to bevel region 303. In some embodiments, a single polishing head 229A is moved through various angles to polish surfaces of bevel region 303 having various orientations such as the surfaces 303A, 303B, and 303C. In some embodiments, multiple polishing heads 229A are positioned at various angles of incidence 324 to simultaneously polish surfaces of bevel region 303 having various orientations.

Polishing process 100 continues with act 123, transferring wafer 300 to a fourth polisher, which is back-side edge buffer 209. Back-side edge buffer 209 can be of the same design as back-side edge polisher 207 and has corresponding embodiments, except that back-side edge buffer 209 uses polishing pads 223 that have a very fine grit or are non-abrasive. In some embodiments, back-side edge buffer 209 is of the same design as back-side edge polisher 207.

Act 125 is securing wafer 300 by back-side 301 to a vacuum chuck 221 of back-side edge buffer 209. Act 127 is buffing wafer 300 over back-side edge region 309. In some embodiments, polishing pads 223 used for buffing 127 have 20 k or finer grit. In some embodiments, polishing pads 223 used for buffing 127 have a soft backing. In some embodiments, polishing pads 223 used for buffing 127 have relatively soft abrasive particles. In some embodiments, polishing pads 223 used for buffing 127 are made from abrasive particles that have been sorted and selected for regularity of shape. In some embodiments, polishing pads 223 used for buffing 127 are non-abrasive pads. In some embodiments, the non-abrasive pads includes a buffing surface formed of a material selected from the group consisting of polyurethane, polyethylene terephthalate (PET), and copolymers thereof.

Act 127, buffing back-side edge region 309, can include measures that reduce scratching as described for act 113, buffing back-side center region 307, and has corresponding embodiments. In some embodiments, buffing 127 includes irrigating the surface being polished. In some embodiments, buffing 127 includes adding a friction-reducing agent to the water used for irrigation. In some embodiments, scratch formation during buffing 127 is reduced by buffing with a low downward force.

Polishing process 100 continues with act 129, which is an optional act of buffing all or part of bevel region 303. In some embodiments, bevel region buffing 129 is combined with back-side edge buffing 127 into a single process carried out with back-side edge buffer 209. A polisher used for bevel region buffing 129 can be of the same design as polishers used for bevel region polishing 127 and has corresponding embodiments, except that a polisher for bevel region buffing 129 uses polishing pads 223 than have a very fine grit or are non-abrasive. Buffing 129 can include additional protocols that reduce scratching as for back-side edge region buffing 127 and has corresponding embodiments.

Polishing process 100 concludes with act 131, which is one or more optional cleaning operations that can be performed within polishing tool 200. Polishing tool 200 can include one or more washers 211 for this purpose. In some embodiments, one or more of these washers 211 use chemical etching. In some other embodiments, none of the cleaning operations of act 131 employ chemical etchants. In some embodiments, all the actions of process 100 are performed within a single polishing tool 200.

The various polishing and buffing operations of polishing process 100 can be performed in any order with the following caveats: back-side center buffing 113 follows back-side center polishing 107, back-side edge buffing 127 follows back-side edge polishing 119, and bevel region buffing 113, where employed, follows bevel region polishing 121. In some embodiments, back-side edge polishing 119 follows back-side center polishing 107.

Figure 5:
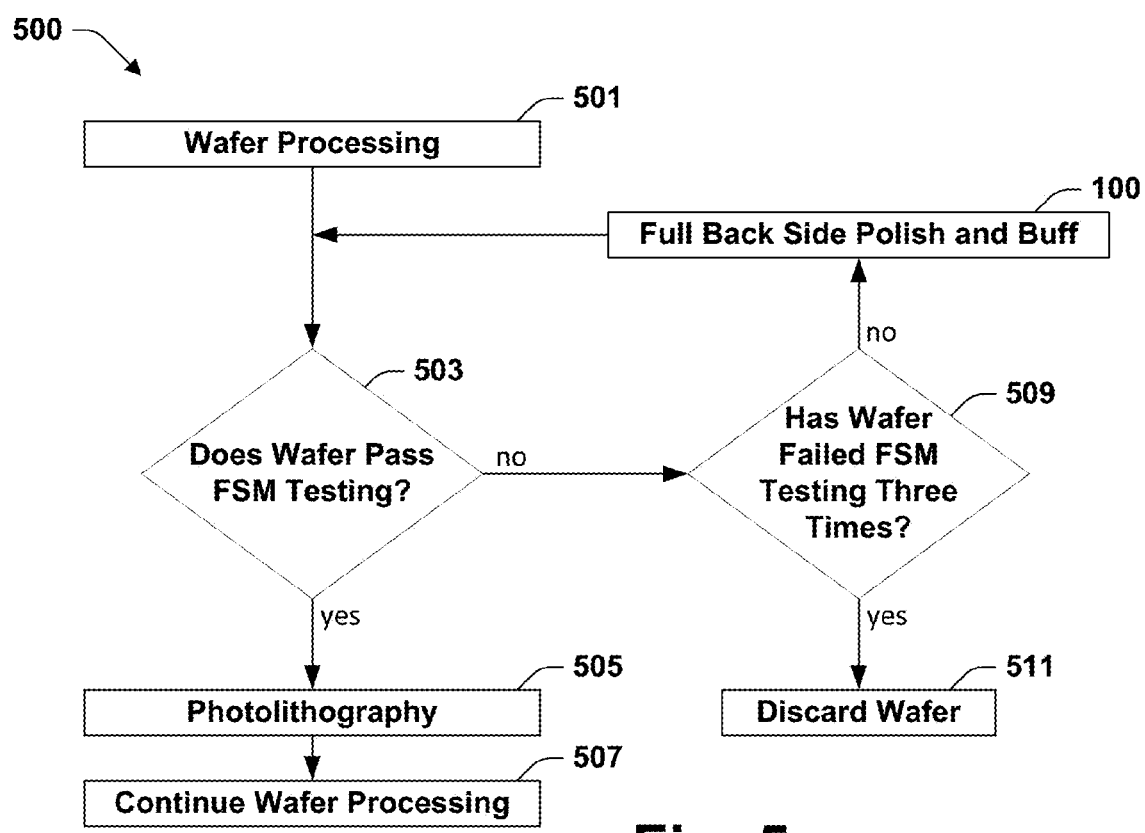
FIG. 5 illustrates an integrated circuit device manufacturing process according to some embodiments of the present disclosure.

According to some embodiments of the present disclosure, a polishing process is employed selectively to treat wafers having defocus issues. The polishing process can be any of the polishing processes provided by the various embodiments of the present disclosure. FIG. 5 illustrates an integrating circuit device manufacturing process 500 providing an example according to some of these embodiments.

Process 500 begins with wafer processing 501. Wafer processing 501 includes various operations that take place prior to testing 503. In most embodiments, processing 501 includes front-end-of-line (FEOL) processing, which forms integrated circuit component devices on front side 305 of wafer 300. In some embodiments, processing 501 includes forming one or more metal interconnect layers. In some embodiments, processing 501 includes chemical mechanical polishing on front side 305 of wafer 300. In some embodiments, processing 501 adds multiple layers to wafer 300 and the last layer added by processing 501 is added to front side 305 just prior to testing 503 and is an inter-level dielectric layer.

Process 500 continues with act 503, which is evaluating wafer 300 to determine the presence of focus spots. Focus spots are locations on front side 305 where the surface of wafer 300 deviates significantly from an expected height when wafer 300 is supported on back-side 301. A deviation that would cause a photolithography system used for photolithography in subsequent act 505 to not focus to an acceptable degree at the affected location would be considered significant. In some embodiments, act 503 employs a focus spot monitor. In some embodiments, act 503 measures surface height at various locations on front face 503 and determines deviations from expected surface height. If a height deviation is found that exceeds a predetermined threshold, wafer 300 fails the test of act 503.

If wafer 300 fails the test of act 503, process 500 proceeds to act 509. Act 509 is an optional act of determining whether too many previous attempts to correct a focus spot issue using polishing process 100 have failed. In some embodiments, the test is whether one previous attempt has failed. In some other embodiments, the test is whether wafer 300 has failed the test of act 503 three times. In some embodiments, act 509 only counts consecutive failures. If the test of act 509 is passed, of if the test of act 503 was failed and the test of act 509 is not employed, wafer 300 is polished according to polishing process 100 or another polishing process provided by one of the various embodiments of the present disclosure. If the test of act 509 is failed, act 511 discards wafer 300.

If the test of act 503 is passed, process 500 advances to subsequent stages of the integrated circuit device manufacturing process. In some embodiments, photolithography 505 immediately follows passing the testing of act 503 with additional processing represented by act 507 following thereafter. In some embodiments, additional processing 507 includes repeated applications of testing 503 and applying polishing process 100 to wafers 300 that fail that testing.

Figure 6:
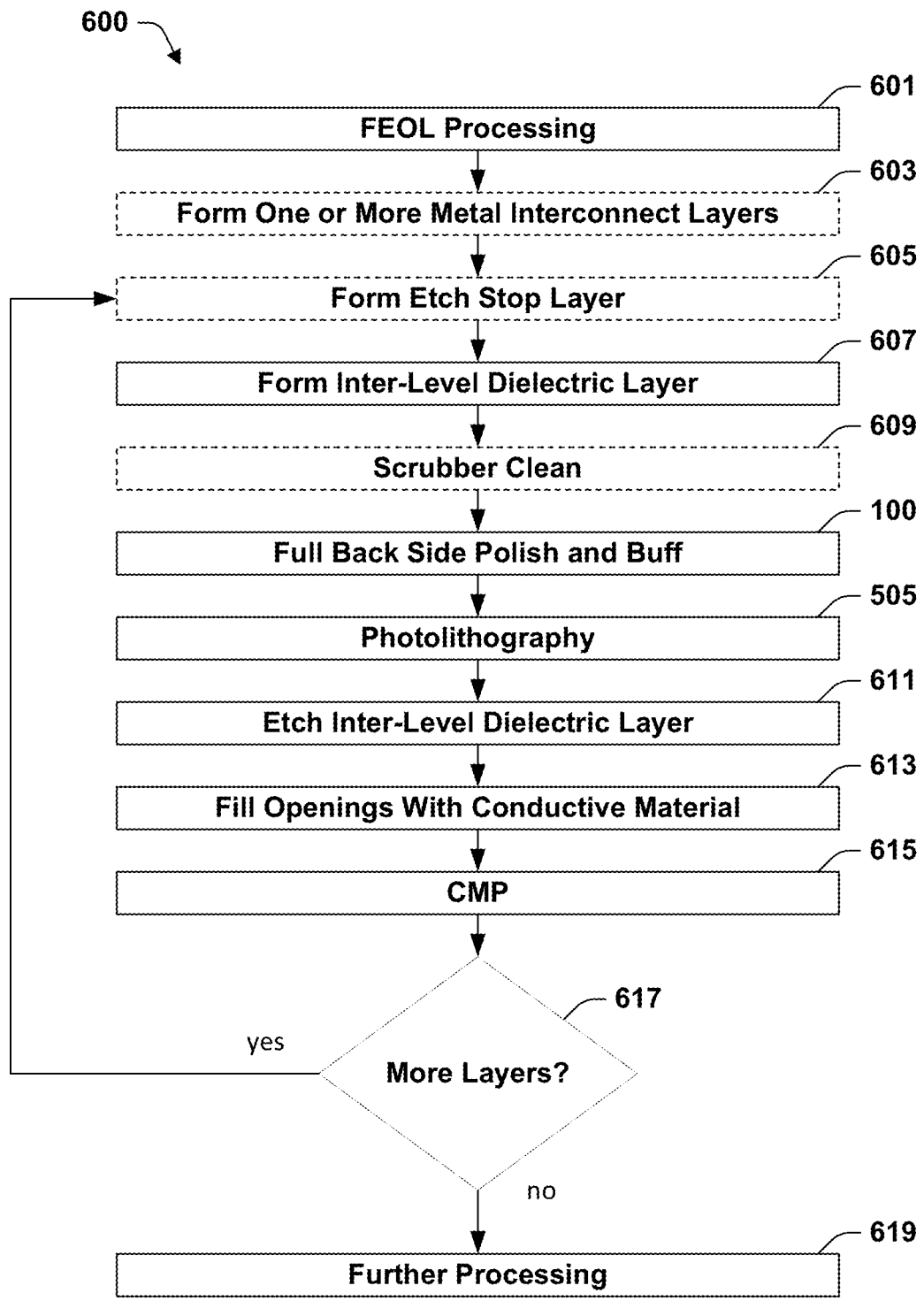
FIG. 6 illustrates an integrated circuit device manufacturing process according to some other embodiments of the present disclosure.
Figure 7:
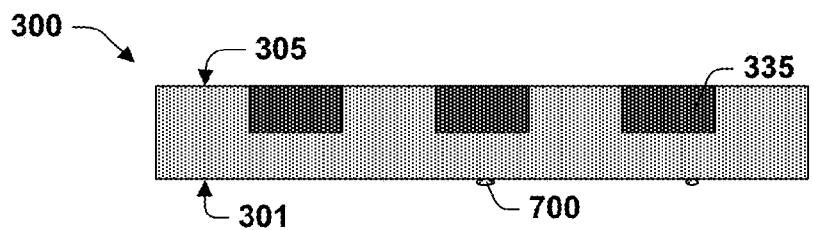
FIGS. 7-14 illustrate a portion of a wafer at intermediate stages in an integrated circuit device manufacturing process according to some embodiments of the present disclosure.
Figure 8:
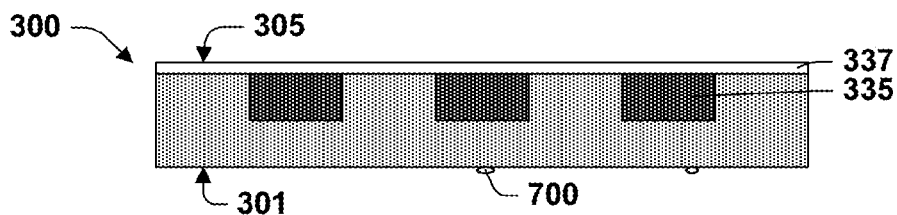

The present disclosure provides integrated circuit device manufacturing processes in which a polishing process provided by one of the various polishing process embodiments of the present disclosure substitutes for a cleaning process that uses chemical etchants. Some conventional cleaning processes use a solution of $H_2O/NH_4OH/H_2O_2$ in a 5:1:1 ratio. In that solution, $NH_4OH$ is a chemical etchant. In some embodiments, polishing process 100 or another polishing process provided by the present disclosure is used and chemical etchants are not used within an integrated circuit device manufacturing process between an act of forming an inter-level dielectric layer and a subsequent process of photolithography FIG. 6 illustrates an integrating circuit device manufacturing process 600 providing an example according to some of these embodiments. Process 600 begins with act 601, FEOL processing, and optionally continues with act 603, forming one more metal interconnect layers. At this stage of processing, wafer 300 includes contacts 335 on front side 305 as shown in FIG. 7. In some embodiments, contacts 335 are source/drain regions. In some embodiments, contacts 335 are tungsten plugs. In some embodiments, contacts 335 are copper of an interconnect structure formed by act 603. At this stage of processing, debris 700 can be present on back-side 301. Process 600 continues with act 605, forming an etch stop layer 337 as shown in FIG. 8. Act 605 and etch stop layer 337 are optional.

Figure 9:
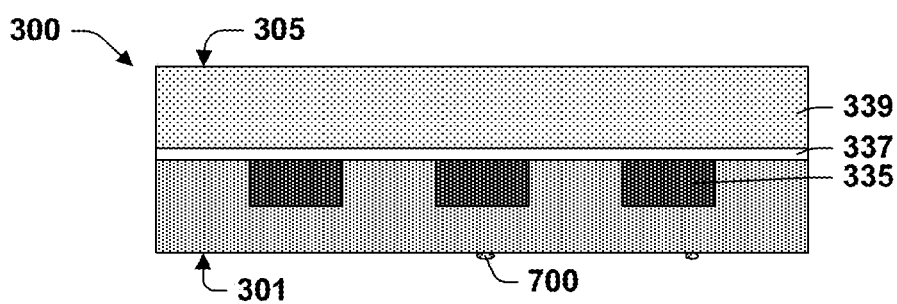

Process 600 continues with act 607, forming an inter-level dielectric layer 339 as shown in FIG. 9. In some embodiments, inter-level dielectric layer 339 is a silicate glass. In some of these embodiments, inter-level dielectric layer 339 is a phosphosilicate glass. In some embodiments, inter-level dielectric layer 339 is a low-k or extremely low-k dielectric.

In some embodiments inter-level dielectric layer 339 is a gate-level dielectric layer. In some embodiments inter-level dielectric layer 339 provides a matrix for a metal interconnect layer that is the first, second, or third metal interconnect layer above the gate level. In some embodiments inter-level dielectric layer 339 provides a matrix for a metal interconnect layer that is above the third metal interconnect layer. Process 600 can be particularly useful for the lower interconnect layers because these have finer pitched structures.

In some embodiments, process 600 optionally continues with act 607, cleaning wafer 300 in a scrubber (not shown). Scrubber clean 609 is a cleaning process that does not use chemical etchants. In some embodiments, scrubber clean 609 uses water and a soft brush. Scrubber clean 609 can leave some contaminants 700 on back-side 301. In some embodiments, contaminants 700 include particles of metal.

Figure 10:
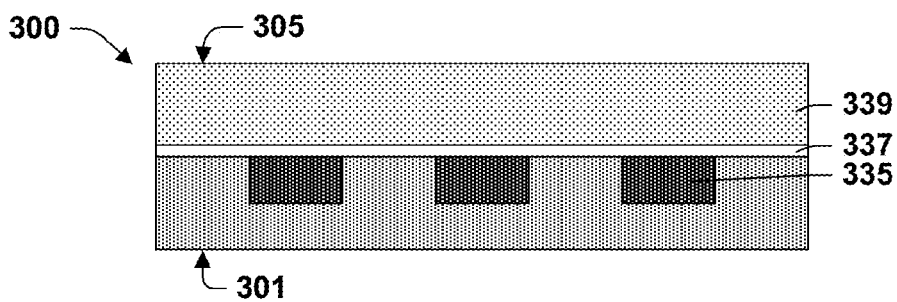

Process 600 continues with the application of polishing process 100 or another polishing process provided by one of the various wafer polishing process embodiments of the present disclosure to clean back-side 301 of wafer 300 as shown in FIG. 10. This prepares wafer 300 for act 505, which is photolithography.

Figure 11:
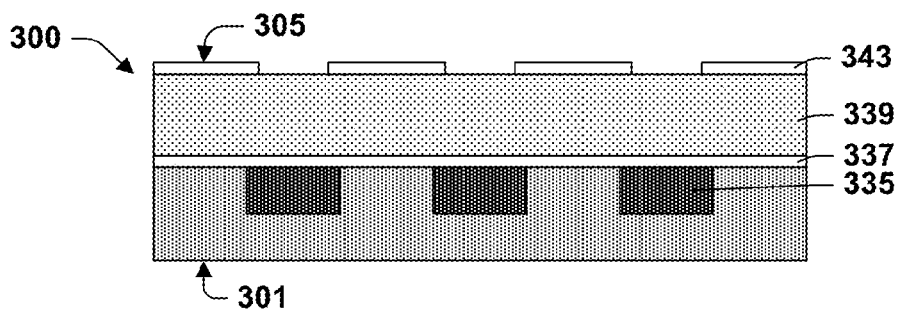
Figure 12:
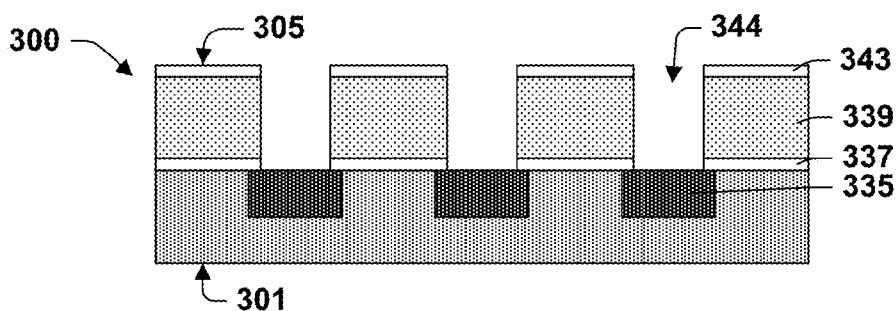
Figure 13:
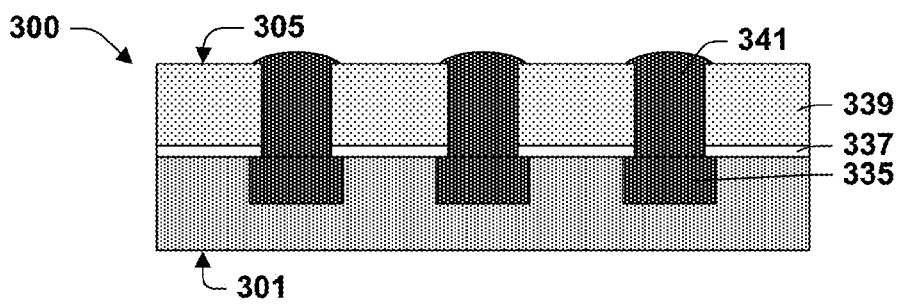

Photolithography 505 includes applying a photoresist 343 to front side 305, selectively exposing photoresist 343, and developing photoresist 343 to produce a patterned photoresist 343 as shown in FIG. 11. Photoresist 343 can be used to pattern a hard mask or can itself be used as a mask for act 611, etching inter-level dielectric layer to form openings 344 as shown in FIG. 12. Etching 611 can include a second etch process to extends openings 344 through etch stop layer 337 as shown in FIG. 12.

Figure 14:
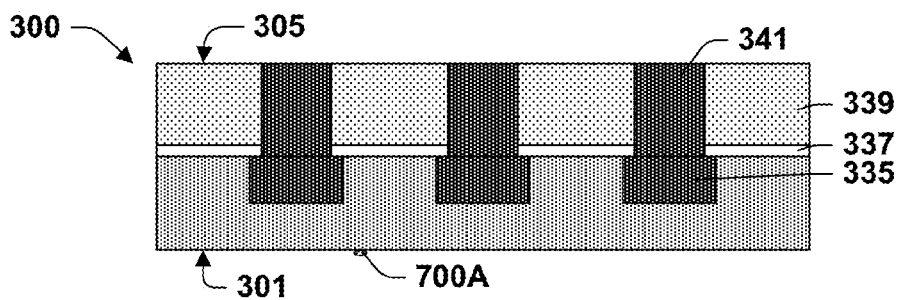

Process boo continues with act 613, filling openings 344 with conductive material 341. In some embodiments, conductive material 341 is polysilicon. In some embodiments, conductive material 341 is tungsten. In some embodiments, conductive material 341 is copper. Process 600 continues with act 615, which is chemical mechanical polishing to produce a structure as shown in FIG. 14. At this stage of processing, new contaminants 700A may be present on back-side 301.

In some embodiments, acts 605 to 615 are repeated to form a series of interconnect layers. Accordingly, process 600 optionally includes act 617, which determines whether there are more layers to form using acts 605 to 615. In some embodiments, wafer 300 is not exposed to chemical etchants between the start of act 605 and the completion of act 615. Process 600 continues with act 619, additional processing to produce integrated circuit devices from wafer 300.

The present disclosure provides a wafer polishing process that includes forming integrated circuit component devices on the front side of a wafer, polishing a first region of the wafer that includes a central area on the back-side of the wafer, polishing a second region that includes a peripheral area on the back-side of the wafer, buffing the first region, and buffing the second region. The first region includes an area outside the second region and the second region includes an area outside the first region. The polishing uses abrasive pads having a first grit. The buffing uses abrasive pads having a second grit that is finer than the first grit or non-abrasive pads. The process significantly reduces scratch-related wafer breakage. The process is useful for selectively treating wafers that have focus spot issues. The process is also useful to prepare wafers for photolithography and can replace processes that use chemical etchants.

The present disclosure provides other wafer polishing and buffing processes that can be used as refinements to the foregoing process and further reduce scratch-related wafer breakage or the occurrence of focus spots. One refinement is to polish the wafers on a bevel region. Another is to polishing with abrasive pads having a soft backing. Another is to polish or buff with pads having relatively soft abrasive particles. Another is to polish or buff with abrasive pad made from abrasive particles that have been sorted and selected for regularity of shape. Another is to irrigate the surface being polished or buffed with an aqueous solution that includes a friction-reducing agent. Another is to buff with abrasive pads having 20 k or finer grit. Another is to buff with non-abrasive pads.

The present disclosure also provides a wafer polishing tool. The tool includes a first polisher configured to polish wafers over a back-side center region, a second polisher configured to receive wafers processed through the first polisher and to buff the wafers over the back-side center region, a third polisher configured to polish wafers over a back-side edge region, and a fourth polisher configured to receive wafers processed through the third polisher and to buff the wafers over the back-side edge region. The third polisher can be configured to polish the wafers over a bevel region. The fourth polisher can be configured to buff the wafers over a bevel region The present disclosure provides a method of polishing a wafer that includes polishing the back-side of the wafer, buffing the back-side of the wafer, and polishing the bevel region of the wafer. The method avoids focus spots, which can be caused by particles originating from the bevel region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A wafer polishing process, comprising:
   forming integrated circuit component devices on a front side of a wafer;

polishing a first region of the wafer that comprises a central area on a back side of the wafer;

polishing a second region of the wafer that comprises a peripheral area on the back side of the wafer;

after polishing the first region, buffing the first region; and after polishing the second region, buffing the second region;

wherein the polishing of the first region and the polishing of the second region are done after the forming of integrated circuit component devices on the front side of the wafer;

the first region comprises an area on the back side of the wafer that is not within the second region;

the second region comprises an area on the back side of the wafer that is not within the first region;

polishing comprises polishing with an abrasive pad having a first grit; and buffing comprises buffing with an abrasive pad having a second grit that is finer than the first grit or buffing with a non-abrasive pad.

2. The wafer polishing process of claim 1, wherein the second region comprises a bevel region of the wafer.

3. The wafer polishing process of claim 1, further comprising polishing a portion of a bevel region of the wafer comprising at least half the area of the bevel region.

4. The wafer polishing process of claim 1, wherein the buffing the first region comprises buffing with an abrasive pad having a grit of 20,000 or finer.

5. The wafer polishing process of claim 1, wherein the buffing the first region or the polishing the first region comprises buffing or polishing with an abrasive pad made from regularly shaped diamonds.

6. The wafer polishing process of claim 1, wherein the buffing the first region or the polishing the first region comprises buffing or polishing with abrasive particles that have been sorted from similarly sized particles of the same material according to shape regularity and selected for regularity of shape.

7. The wafer polishing process of claim 1, wherein the buffing the first region comprises buffing with a non-abrasive pad.

8. The wafer polishing process of claim 1, wherein the buffing the first region or the polishing the first region comprises buffing or polishing with an abrasive tape that has a backing that is as soft or softer than polyurethane or polyethylene terephthalate (PET).

9. The wafer polishing process of claim 1, wherein the buffing the first region comprises buffing with a downward force of 0.8 psi or less.

10. The wafer polishing process of claim 1, wherein the buffing the first region or the polishing the first region comprises irrigating the surface undergoing buffing or polishing with an abrasive-free slurry.

11. An integrated circuit device manufacturing process, comprising:

evaluating wafers to determine the presence of focus spots; and selectively applying the wafer polishing process of claim 1 to those wafers that have focus spots.

12. The wafer polishing process of claim 1, wherein the buffing the first region or the polishing the first region comprises irrigating the surface undergoing buffing or polishing with an aqueous solution comprising a friction-reducing agent.

13. The wafer polishing process of claim 12, wherein the friction-reducing agent is a surfactant.

14. The wafer polishing process of claim 12, wherein the friction-reducing agent is a chelating agent.

15. A wafer polishing tool, comprising:

a first polisher configured to polish a back-side center region of wafers;

a second polisher configured to receive wafers processed through the first polisher and to buff the wafers over the back-side center region;

a third polisher configured to polish wafers over a back-side edge region; and a fourth polisher configured to receive wafers processed through the third polisher and to buff the wafers over the back-side edge region.

16. The wafer polishing tool of claim 15, wherein one of the polishers comprises an abrasive tape that determinably by inspection comprises particles that have been sorted from similarly sized particles of the same material according to shape regularity and selected for regularity of shape.

17. A method of polishing a wafer comprising a front side, a back-side, and a bevel region between the front side and the back side, comprising:

polishing a peripheral region of the back side of the wafer;
buffing the peripheral region of the back side of the wafer;
polishing a center region of the back side of the wafer;
buffing the center region of the back side of the wafer; and
polishing the bevel region of the wafer;

wherein the back side of the wafer is polished and buffered to be a substantial planar surface after polishing and buffing the peripheral region and the center region.

18. The method of polishing a wafer of claim 17, wherein the buffing of the back side of the wafer is buffing with an abrasive pad made from regularly shaped diamonds.

19. The method of polishing a wafer of claim 17, wherein the buffing of the back side of the wafer is buffing with a non-abrasive pad.

20. The method of polishing a wafer of claim 17, wherein an aqueous solution comprising a wetting agent is applied to the back side of the wafer while polishing the back side of the wafer.

* * * * *